(12) United States Patent
Yan et al.

(10) Patent No.: US 6,296,780 B1
(45) Date of Patent: *Oct. 2, 2001

(54) SYSTEM AND METHOD FOR ETCHING ORGANIC ANTI-REFLECTIVE COATING FROM A SUBSTRATE

(75) Inventors: Chun Yan, Santa Clara; Yan Ye, Campbell; Diana Ma, Saratoga, all of CA (US)

(73) Assignee: Applied Materials Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/986,427

(22) Filed: Dec. 8, 1997

(51) Int. Cl.[7] .................................................. H01L 21/3213
(52) U.S. Cl. .............................. 216/67; 216/75; 438/714; 438/717; 438/720; 438/734
(58) Field of Search ..................... 438/706, 710, 438/714, 717, 720, 723, 725, 734, 735, 736, 737, 738, 742, 743; 216/63, 67, 72, 74, 75

(56) References Cited

U.S. PATENT DOCUMENTS

| | | |
|---|---|---|
| 5,277,757 | 1/1994 | Sato . |
| 5,399,237 | 3/1995 | Keswick et al. . |
| 5,550,085 | 8/1996 | Liu . |
| 5,607,776 | 3/1997 | Mueller et al. . |
| 5,846,884 * | 12/1998 | Naeem et al. ........................ 438/714 |
| 5,882,489 * | 3/1999 | Bersin et al. .................... 204/192.35 |
| 5,883,007 * | 3/1999 | Abraham et al. .................... 438/714 |

FOREIGN PATENT DOCUMENTS

| | | |
|---|---|---|
| 0 596 551 A1 | 5/1994 | (EP) . |
| 0 650 182 A1 | 4/1995 | (EP) . |
| 2 304 457 | 3/1997 | (GB) . |
| WO 97/45866 | 12/1997 | (WO) . |

OTHER PUBLICATIONS

Database WPI, Section CH, Week 9024, Derwent Publications Ltd., London, GB; Class L03, AN 90–181125, XP002097439 & JP 01 087790 A (Dainippon Printing Co Ltd), Mar. 31, 1989.
Patent Abstracts of Japan, vol. 096, No. 006, Jun. 28, 1996 & JP 08 045918 A (Casio Comput Co Ltd), Feb. 16, 1996.
Patent Abstracts of Japan, vol. 097, No. 008, Aug. 29, 1997 & JP 09 097797 A (Sony Corp), Apr. 8, 1997.

* cited by examiner

Primary Examiner—Handy Gulakowski
Assistant Examiner—Allan Olsen

(57) ABSTRACT

The present invention is embodied in a method and apparatus for etching an organic anti-reflective coating (OARC) layer and a titanium nitride anti-reflective coating (TiN ARC) layer deposited on a substrate located within a processing chamber, without the need for removing the substrate being processed from the processing chamber in which it is situated and without the need for intervening processing steps, such as chamber cleaning operations. The substrate has a base, an underlying oxide layer above the base, an overlying layer above the underlying layer, a middle conductive layer, a TiN ARC layer, and a top OARC layer spun on top of the TiN ARC.

11 Claims, 4 Drawing Sheets

SYSTEM AND METHOD FOR ETCHING ORGANIC ANTI-REFLECTIVE COATING FROM A SUBSTRATE

BACKGROUND OF THE INVENTION

1. Field of the Invention

The present invention relates in general to an apparatus for, and the processing of, semiconductor substrates. In particular, the invention relates to the etching of anti-reflective coatings during substrate processing.

2. Related Art

The critical dimensions (CD's) and geometries of semiconductor devices have decreased dramatically in size since they were first introduced several decades ago. Although, currently, most semiconductor devices are fabricated with feature sizes of about 0.5 microns, it is desirable to produce semiconductor devices, for example, semiconductor integrated circuit chips, with smaller feature sizes, such as 0.35 microns and lower.

One important micro geometry of such semiconductor devices includes the formation of a patterned thin film on a base substrate of the device by chemical reaction of gases. When patterning the thin films, it is desirable that fluctuations in line width and other critical dimensions be minimized. Errors in these dimensions can result in variations in device characteristics or open-/short-circuited devices, thereby adversely affecting device yield. Thus, as feature sizes decrease, structures must be fabricated with greater accuracy. As a result, some manufacturers now require that variations in the dimensional accuracy of patterning operations be held to within 5% of the dimensions specified by the designer.

Some substrate processing systems employ photolithographic techniques to pattern layers. These techniques employ photoresist or other light-sensitive material deposited on a wafer. A photomask having transparent and opaque regions embodying the desired pattern is positioned over the photoresist. When the mask is exposed to light, the transparent portions allow exposure of the photoresist in the transparent regions, but not in the regions where the mask is opaque. The light causes a chemical reaction in the exposed portions of the photoresist (e.g., photosolubilization or polymerization). A suitable chemical, chemical vapor or ion bombardment process is then used to selectively attack either the reacted or unreacted portions of the photoresist. With the remaining photoresist pattern acting as a mask, the underlying layer may then undergo further processing. For example, the layer may be doped or etched, or other processing can be performed.

Some photolithographic techniques often involve the use of equipment known as steppers, which are used to mask and expose photoresist layers. Steppers often use monochromatic (single-wavelength) light, enabling them to produce the detailed patterns required in the fabrication of fine geometry devices. However, as a substrate is processed, the topology of the substrate's upper surface becomes progressively less planar. This uneven topology can cause reflection and refraction of the monochromatic light, resulting in exposure of some of the photoresist beneath the opaque portions of the mask. As a result, this uneven surface topology can alter the mask pattern transferred to the photoresist layer, thereby altering the desired dimensions of the structures subsequently fabricated.

One phenomenon resulting from these reflections is standing waves. When a photoresist layer is deposited on a reflective underlying layer and exposed to monochromatic radiation (e.g., deep ultraviolet (UV) light), standing waves may be produced within the photoresist layer. In such a situation, the reflected light interferes with the incident light and causes a periodic variation in light intensity within the photoresist layer in the vertical direction. Standing-wave effects are usually more pronounced at the deep UV wavelengths used in modern steppers than at longer wavelengths because surfaces of materials such as oxide, nitride, and polysilicon are more reflective at deep UV wavelengths. The existence of standing waves in the photoresist layer during exposure causes roughness in the vertical walls formed when sections of the photoresist layer are removed during patterning, which translates into variations in linewidths, spacing and other critical dimensions.

There are several techniques currently used to help reduce and/or eliminate the standing waves and problems associated with these waves, while achieving required dimensional accuracies. The use of an anti-reflective coating (ARC) is one such technique. An ARC's optical characteristics are such that reflections occurring at inter-layer interfaces are minimized. The ARC's absorptive index is such that the amount of monochromatic light transmitted (in either direction) is minimized, thus attenuating both transmitted incident light and reflections thereof. The ARC's refractive and absorptive indices are fixed at values that cause any reflections which might still occur to be canceled.

One type of ARC is a titanium nitride anti-reflective coating (TiN ARC). TiN ARC's are typically used with semiconductor substrates that have conductive features. Conductive features are used to electrically connect devices formed on the semiconductor substrates. The conductive features typically have a bottom barrier layer, an electrically conductive metal-containing layer, such as an aluminum alloy, and a top titanium nitride anti-reflective coating. Although titanium nitride was once deemed to be a satisfactory anti-reflective coating, it has been recently determined that it is not a relatively good anti-reflective coating. Consequently, another anti-reflective layer, such as an organic anti-reflective coating (OARC) or a bottom anti-reflective coating (BARC) is usually spun on top of the TiN ARC.

The substrate with the additional OARC layer is then processed by reactive ion etch processing to selectively etch portions of the substrate. Etching comprises introducing a selected process gas into an etching chamber and producing a plasma from the process gas. The plasma selectively etches the substrate and creates volatile etch by product compounds which are removed from the etching chamber. The process gas typically used for etching the OARC and TiN ARC is a mixture of gases such as, for example, $Cl_2$ with $N_2$, Ar or $BCl_3$.

During the etch process, several factors must be considered, such as CD control, etch rate non-uniformity, photoresist loss and etch selectivity. Good CD control and etch rate uniformity allows the fabrication of semiconductor devices with smaller feature sizes. In addition, with regard to photoresist loss and etch selectivity, a material's reactivity with respect to another material with regard to a given etchant is known as the material's etch selectivity. Etch selectivity is usually denoted by a ratio of the etch rate of the material to be removed to that of the other material. A high etch selectivity is therefore often desirable because, ideally, an etchant should selectively etch only the intended areas of the layer being etched and not erode other structures which may already exist on the substrate being processed. In other words, a material with high etch selectivity substantially resists unintended etching during the intended etching of another material.

For example, high etch selectivity of a first layer with respect to a second overlying layer is desirable when different patterns are to be etched into the first and second layers. High etch selectivity is desirable in such situations because the underlying layer will not be significantly eroded in areas where the second layer is completely etched away if the first layer's etch selectivity is low. The etching operation removes not only the intended regions of the second layer, but also portions of the first layer underlying those regions. While a small amount of the first layer is normally removed in such situations, extremely low etch selectivity may permit substantial etching of the first layer.

However, the current combination of process gases used to etch the OARC and TiN ARC produces relatively poor CD control and non-uniform etch rates. Also, typical etch selectivities are relatively low and photoresist loss is relatively high. Excessive etching of the photoresist layer can cause excessive deposition of polymeric resist etchant byproducts on the substrate and on the walls of the etching apparatus. Excessive quantities of such deposits are difficult to remove. Thus, typical etch processes used to etch the OARC and TiN ARC produce inadequate results due to the increased photoresist loss and poor CD control, etch rate uniformity and etch selectivity. As a result, currently, the addition of an OARC to a TiN ARC on a semiconductor substrate makes the etch process more difficult and complicated.

Therefore, what is needed is an etch system for effectively etching the OARC and TiN ARC layers that has good CD control and limits etch rate non-uniformity. What is also needed is a system that avoids unwanted etching of layers underlying the layer being patterned. What is also needed is a system for creating such a layer using a minimal number of processing steps. What is additionally needed is an accurate etch process. What is additionally needed is an etching system that provides high etch selectivity. What is further needed is an etching system that is amenable to mass production of circuit chips in conventional etching apparatus.

Whatever the merits of the above mentioned systems and methods, they do not achieve the benefits of the present invention.

SUMMARY OF THE INVENTION

To overcome the limitations in the prior art described above, and to overcome other limitations that will become apparent upon reading and understanding the present specification, the present invention is embodied in a method and apparatus for etching a TiN ARC layer and an OARC layer or a multi-layer titanium and titanium anti-reflective coating spun on top of the TiN ARC layer during substrate processing.

The present invention is embodied in a process for etching the TiN ARC and OARC deposited on a substrate located within a processing chamber. The process can be performed without the need for removing the substrate being processed from the processing chamber in which it is situated and without the need for intervening processing steps, such as chamber cleaning operations. This process is thus referred to herein as an in situ process. The substrate has a base, an underlying oxide layer above the base, an overlying layer above the underlying layer, a middle conductive layer, a TiN ARC layer, and a top OARC layer spun on top of the TiN ARC. The base is preferably a semiconductor wafer, the underlying layer is preferably a silicon oxide insulative layer, the overlying layer is preferably a base diffusion barrier and the middle layer is preferably an electrically conductive layer, such as AlCu.

In the preferred embodiment, the substrate is processed with multiple stages. First, the OARC layer and the TiN ARC layer on the substrate are etched with a first single stage step. This is accomplished by introducing an etchant gas comprising a chlorine-comprising gas and a carbon-fluoride gas, a carbon-chlorine-flourine comprising gas or a carbon-fluoride-hydrogen gas into the process zone, and generating a plasma from the etchant gas. By chlorine-comprising gas, there is meant a gaseous species, such as for example, $Cl_2$ or HCl. By carbon-fluoride gas, there is meant a gaseous species containing carbon and fluorine, such as for example, $C_xF_y$, which can be $CF_4$, $C_2F_4$, $C_2F_6$, and combinations thereof. By carbon-chlorine-flourine comprising gas, there is meant a gaseous species containing carbon, chlorine and fluorine, such as for example, $CF_3Cl$. By carbon-fluoride-hydrogen gas, there is meant a gaseous species containing carbon, fluorine, and hydrogen, such as for example, $C_xH_yF_z$, which can be $CHF_3$.

The plasma etches both the OARC and TiN ARC layers on the substrate. A mainetch step is then performed for etching the conductive layer with a process gas comprising, for example, a combination of $Cl_2$ gas, $BCl_3$ gas and $CHF_3$ gas. Next, an overetch step is performed for etching the base diffusion barrier and the oxide layer with a process gas comprising, for example, a combination of $Cl_2$ gas and $BCl_3$ gas. Last, a fifth dechucking step can be performed for releasing the substrate 100. In addition, a secondary step can be performed after the first step to improve the results, namely, to eliminate notching. For example, a process gas comprising a combination of $Cl_2$ gas and $BCl_3$ gas can be utilized in the secondary step.

Throughout the process, the substrate can remain in the processing chamber, i.e., all steps can be performed as an in situ process. As such, the present invention can eliminate the need to remove the substrate from the processing chamber between etching of the different layers, for chamber cleanings and the like. This improves throughput, reduces downtime and reduces contamination, among other benefits. In addition, the in situ processes of the present invention allows accurate control over the etch rate of the layers.

The foregoing and still further features and advantages of the present invention as well as a more complete understanding thereof will be made apparent from a study of the following detailed description of the invention in connection with the accompanying drawings and appended claims.

BRIEF DESCRIPTION OF THE DRAWINGS

Referring now to the drawings in which like reference numbers represent corresponding parts throughout.

DETAILED DESCRIPTION OF THE PREFERRED EMBODIMENT

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

I. Components

Figure 1:
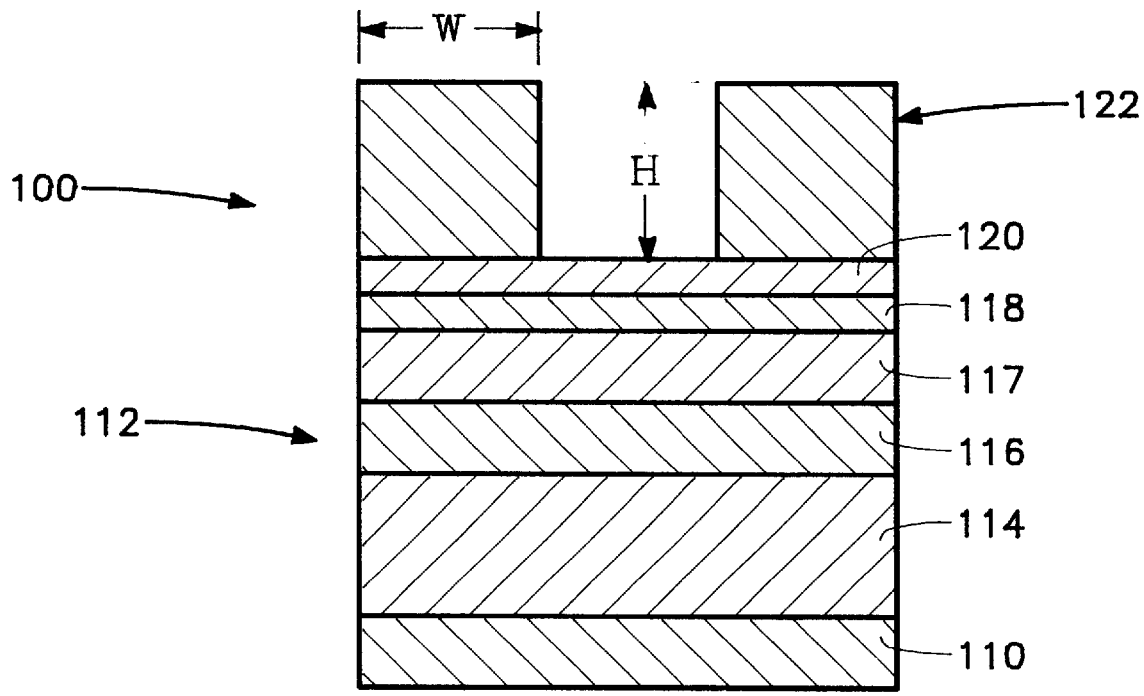
FIG. 1 is a vertical cross-section of a substrate having a titanium nitride anti-reflective coating and an organic anti-reflective coating.

FIG. 1 is a vertical cross-section of a substrate having a titanium nitride anti-reflective coating (TiN ARC) and an organic anti-reflective coating (OARC). The present invention is embodied in a system and method for etching a substrate, such as silicon, in a plasma reactor chamber. The etching can be performed in situ (without having to remove the substrate from the processing chamber in which it is situated).

The method according to the present invention is performed on a substrate 100 comprising a base 110, with a horizontal layer of patterned conductive features 112 thereon. The base 110 can be made of any material, such as semiconductor, glass, ceramic, metal, or polymer. The base 110 is preferably a semiconductive wafer, such as a silicon wafer. The features 112 on the base 110 comprise a plurality of layers, such as for example, an underlying layer 114 above the base 110, an overlying layer 116 above the underlying layer 114, a middle layer 117, a titanium nitride anti-reflective coating (TiN ARC) layer 118, and a top organic anti-reflective coating (OARC) layer 120, such as a carbon containing material, spun on top of the TiN ARC 118. The carbon containing material can be a polymeric material.

The underlying layer 114 is preferably an insulative oxide layer, the overlying layer 116 is preferably a base diffusion barrier and the middle layer 117 is preferably a middle electrically conductive layer. The insulative oxide layer 114 can be a silicon oxide layer or the like. The base diffusion barrier layer 116 can comprise titanium, tungsten, titanium-tungsten, titanium nitride, or a combination of these. The middle electrically conductive layer 117 can be an alloy of aluminum, silicon, and copper. The TiN ARC layer 118 is preferably about 200 Å to about 1600 Å thick, and more typically about 250 Å thick. The layers 116, 117, 118, 120 are preferably deposited by physical vapor deposition (PVD). The insulative oxide layer 114 can be deposited by chemical vapor deposition (CVD).

Figure 2:
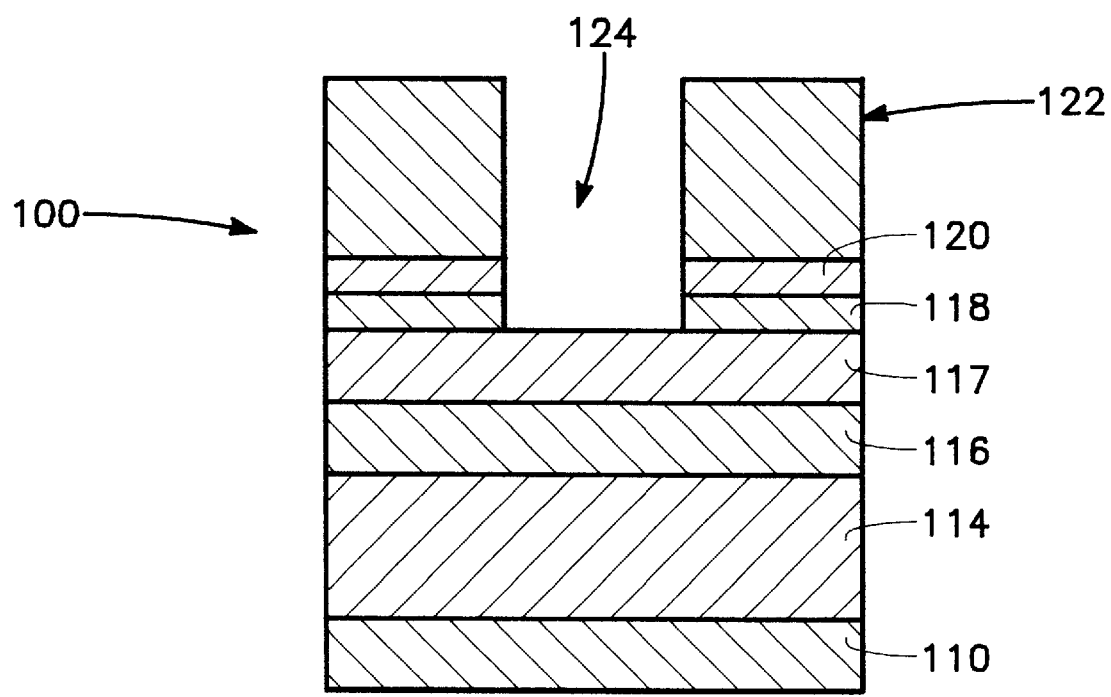
FIG. 2 is a vertical cross-section of the substrate of FIG. 1, after etching of the titanium nitride anti-reflective coating and the organic anti-reflective coating.

FIG. 2 is a vertical cross-section of the substrate of FIG. 1, after etching, in accordance with the present invention (described in detail below), of the titanium nitride anti-reflective coating and the organic anti-reflective coating. A resist layer 122 which is resistant to etching, such as photoresist, is applied as a predetermined photoresist pattern to protect portions of the substrate during the etching process. The photoresist pattern is defined by trenches and holes 124 and the upstanding features 122. The upstanding features 122 typically have a width, W, of less than about 0.5 $\mu$m and a height, H, of less than about 1.0 $\mu$m. The features 122 form a profile angle, $\alpha$, which is typically from about 85° to about 90° relative to the upper surface plane of the OARC layer 120. Typically, it is the overlying layer 116 that is to be etched. In the etching process described below, vias are etched at the bottom of trenches and holes 124 in order to form conductive interconnects within the etched holes.

II. Process Chambers

Figure 3:
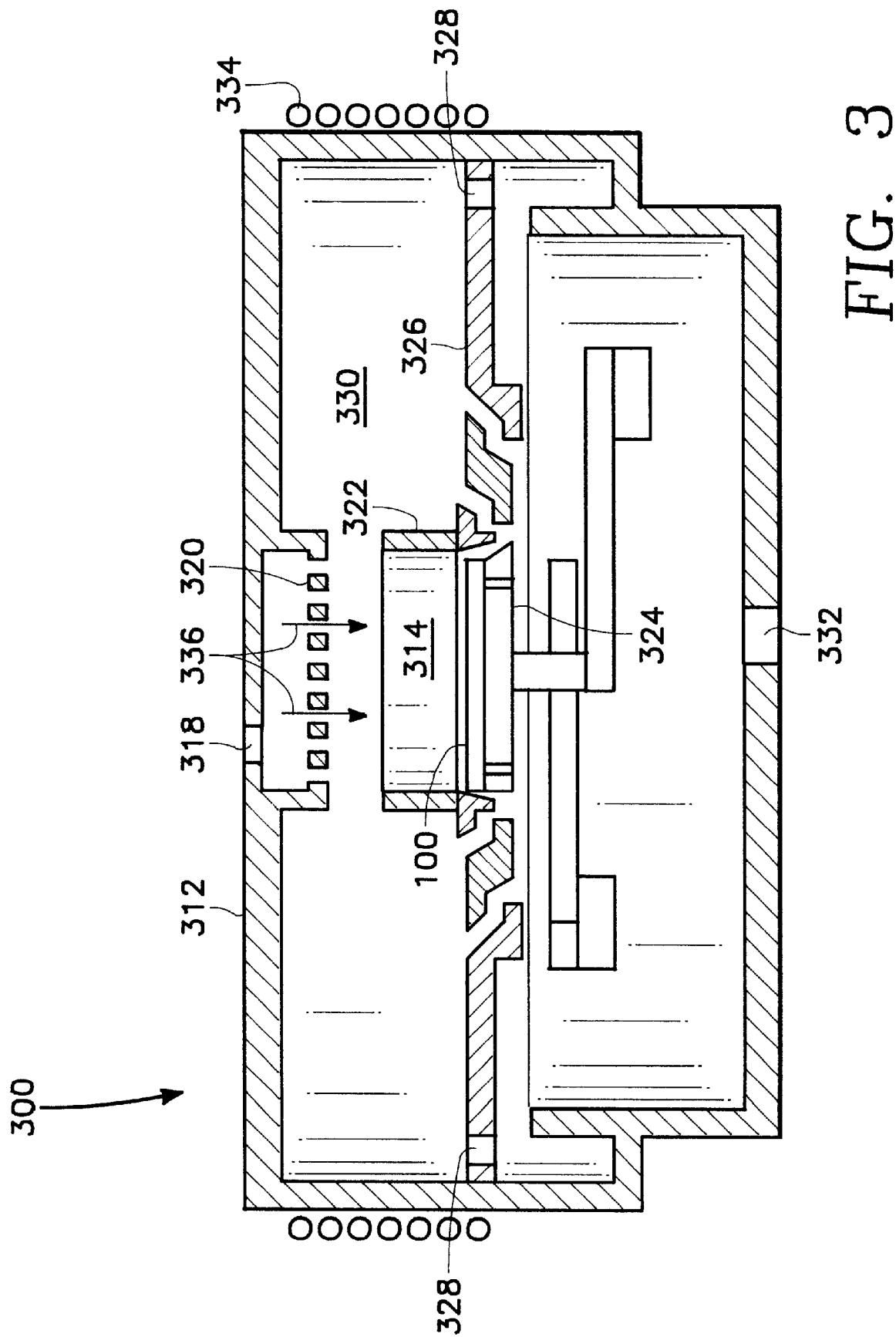
FIG. 3 is a vertical cross-section of an apparatus suitable for practicing the processes of the present invention.

Several reactor chambers can be used with the system and method of the present invention. FIG. 3 is a vertical cross-section of an apparatus suitable for practicing the processes of the present invention. The reaction device 300 comprises an etching chamber 312 having an etch zone 314. For typical etching (the specific etching process of the present invention will be discussed below), process gas is introduced into the etching chamber 312 through the gas inlet 318. The process gas then passes through a "showerhead" diffuser plate 320 which distributes the process gas in the etching zone 314. A surrounding focus ring 322 substantially maintains the generated plasma in the etching zone 314. In operation, a substrate 100, is placed on the cathode 324 and a process gas (depending on the layer/layers to be etched) is introduced through the gas inlet 318 into the etching chamber 312. A plasma is generated from the process gas to selectively etch the layers of the substrate 100.

A barrier or pumping plate 326 has a plurality of exhaust holes 328 therethrough. The ring 322 separates the etching chamber 312 into two zones, namely, the etching zone 314 and a non-etching zone 330. The exhaust holes 328 are in fluid communication with a vacuum pump (not shown) via an exhaust port 332 for exhausting spent process gas and volatile etch byproducts from the etching chamber 312. The reaction device 300 can be magnetically enhanced. A magnetic coil 334 can be provided around the etching chamber 312 to magnetically enhance the plasma formed from the process gas in the etching zone 314. A plasma of the process gas is generated in the etch zone 314. The flow of the process gas is represented by the arrows 336.

Figure 4:
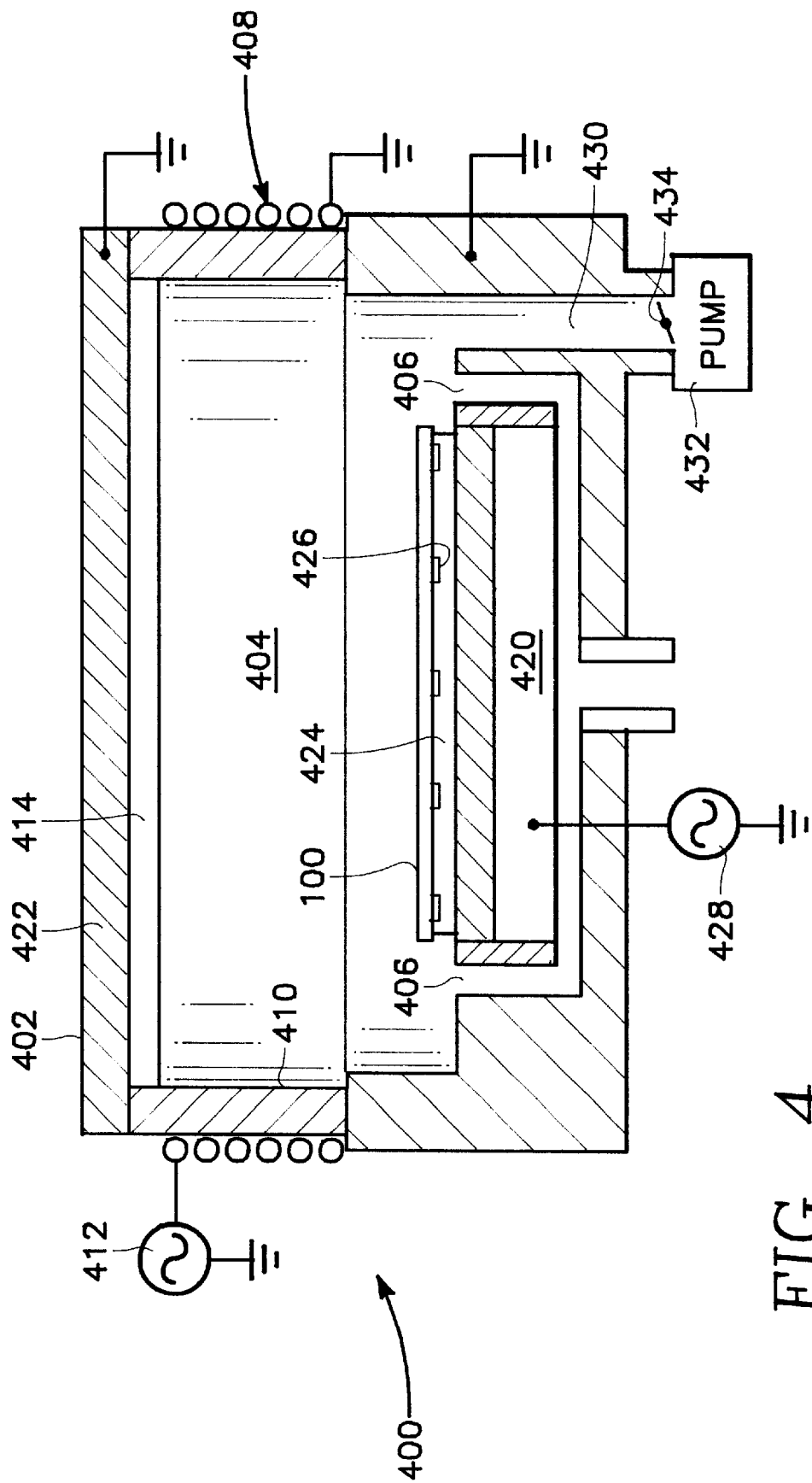
FIG. 4 is a vertical cross-section of another apparatus suitable for practicing the processes of the present invention.

Similarly, FIG. 4 is a vertical cross-section of an apparatus suitable for practicing the processes of the present invention. An etching apparatus 400 suitable for practicing the etching process of the present invention is schematically shown in FIG. 4, and described in more detail in U.S. patent application Ser. No. 08/138,060, filed on Oct. 15, 1993, by Rice, et al., now U.S. Pat. No. 5,477,975 and in European Patent Document No. 0,520,519 A1, by Collins, et al., published on Dec. 30, 1992—both of which are incorporated herein by reference.

Generally, the etching apparatus 400 comprises a process chamber 402 having a process zone 404. Process gas is distributed in the process zone 404 using a gas manifold 406 peripheral to the wafer. Typically, the process gas is supplied to the manifold 406 using one or more sources of pressurized gas via a computer controlled flow controller (not shown).

A cylindrical antenna coil 408 is wrapped around sidewall 410 of the process chamber 402. The coil 408 is connected to an RF current source 412. When an RF current is applied through the coil 408, the coil 408 inductively couples energy into the chamber 402 for generating a plasma from the process gas in the process zone 404. The sidewall 410 of the chamber 402 is made of a dielectric material, such as quartz or ceramic, to preclude conductive coupling between the sidewalls 410 and the coil 408. A conventional heating element (not shown) near the sidewall 410 is provided for heating the sidewall 410 to a temperature sufficiently high to prevent the deposition of condensable etchant byproducts on the sidewall 410.

A slab of crystalline silicon material 414 is provided at the top of the process zone 404. When the silicon slab 414 is heated using a conventional heating element (not shown), the reactive silicon atoms at the surface of the slab react with gaseous species in the process zone 404. For example, when a carbon-fluoride gas is introduced into the chamber 402 and a plasma generated therefrom, the silicon atoms scavenge or combine with the fluorine species of the plasma to form gases such as $SiF_4$. The scavenging process reduces the amount of fluorine in the process zone 404, thereby increasing the carbon to fluorine ratio in the plasma. Higher carbon ratios are desirable to form carbon-rich polymers which deposit upon, and passivate, the freshly etched portions of the substrate 100. A detailed description of the scavenging process is disclosed in the aforementioned U.S. patent by Rice, et al.

The substrate 100 is placed on a cathode 420 in the chamber 402, and an electrically grounded anode 422 forms the top of the chamber 402. The substrate 100 can be held in place during the etching process using a mechanical chuck 424 with grooves 426 in which a coolant gas, such as helium, is held to control the temperature of the substrate 100. Alternatively, an electrostatic chuck, such as the chuck described in U.S. patent application Ser. No. 08/137,279, filed on Oct. 14, 1993, by Collins, et al., can also be used. When the cathode 420 is electrically biased with respect to the anode 422 using an RF source 428, the plasma in the chamber 400 impinges upon and the resultant plasma-activated reaction etches the substrate 100. Optionally, a magnetic field (not shown) can be used to enhance the density or uniformity of the plasma.

Spent process gas and etchant byproducts are exhausted from the process chamber 400 through am exhaust 430 which is connected to an exhaust system 432 capable of achieving a pressure of about 10–3 mTorr in the process chamber 402. A throttle valve 434 is provided in the exhaust 430 for controlling the pressure in the chamber 402.

Figure 5:
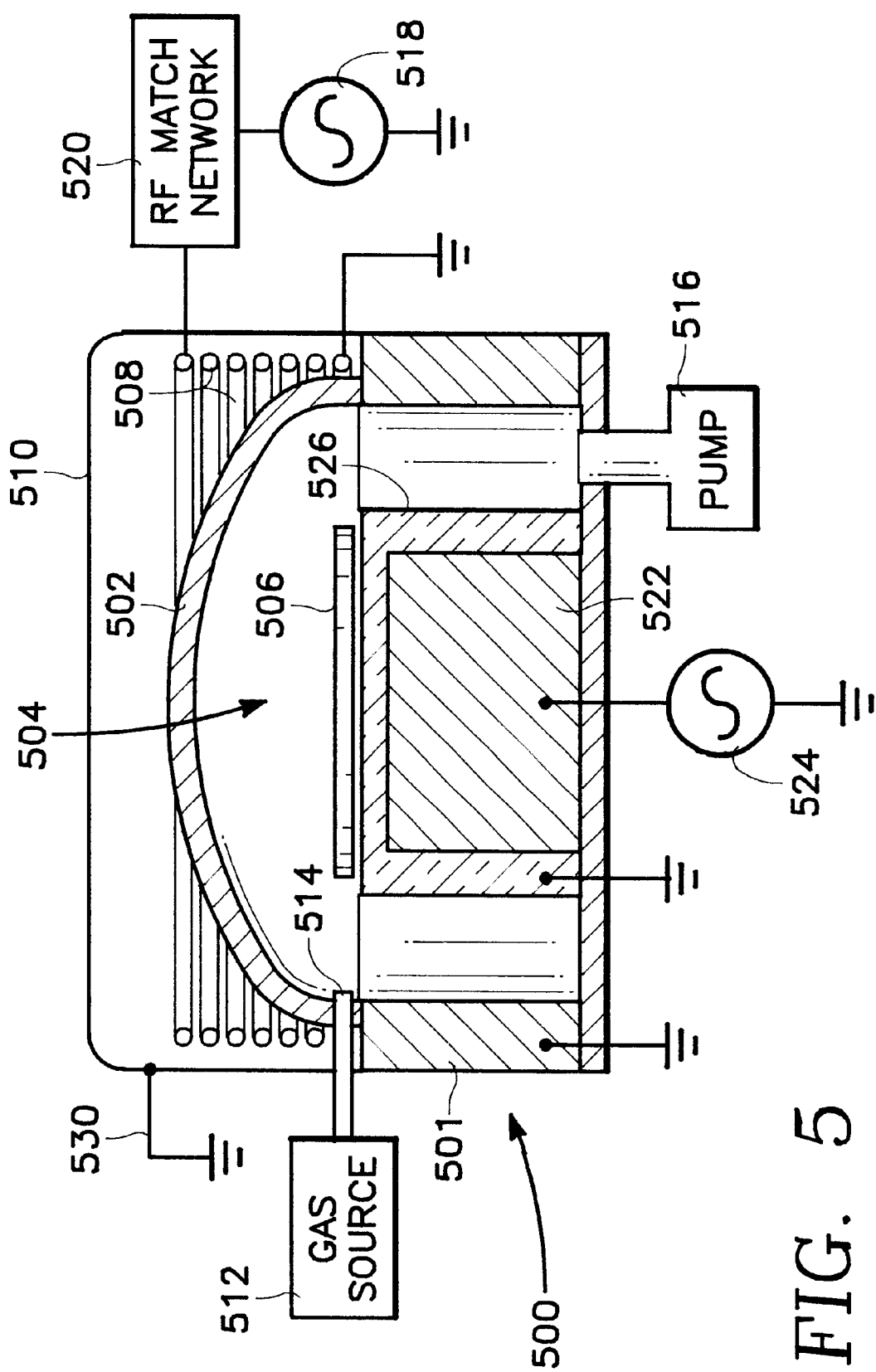
FIG. 5 is a vertical cross-section of another apparatus suitable for practicing the processes of the present invention.

FIG. 5 is a vertical cross-section of another apparatus suitable for practicing the processes of the present invention, and in particular the preferred apparatus. An inductively coupled RF plasma reactor includes a reactor chamber 500 having a grounded conductive cylindrical sidewall 501 and a dielectric ceiling 502, the reactor including a wafer pedestal or cathode 504 for supporting a semiconductor wafer 506 in the center of the chamber, a cylindrical inductor coil 508 surrounding an upper portion of the chamber beginning near the plane of the top of the wafer or wafer pedestal 504 and extending upwardly therefrom toward the top 510 of the chamber, a processing gas source 512 and gas inlet 514 for furnishing a processing gas into the chamber interior and a pump 516 for controlling the chamber pressure.

The coil inductor 508 is energized by a plasma source power supply or RF generator 518 through a conventional active RF match network 520, the top winding of the coil inductor 508 being "hot" and the bottom winding being grounded. The wafer pedestal 504 includes an interior conductive portion 522 connected to a bias RF power supply or generator 524 and an exterior grounded conductor 526 (insulated from the interior conductive portion 522). A conductive grounded RF shield 530 surrounds the coil inductor 508.

III. Detailed Process

Referring to FIGS. 1 and 2 along with FIG. 5, to effect the process, the chamber 500 is evacuated to less than about 1 mTorr, and the substrate 100 is transferred to the chamber 500. Etchant process gas 512 is introduced into the chamber, and the chamber 500 is maintained at a pressure ranging from about 6 to about 20 mTorr. The etchant gas 512 is introduced into the chamber 500 through the gas inlet 514. The etchant gas 512 comprises a chlorine-comprising gas and a carbon-fluoride gas, a carbon-fluoride-hydrogen gas, a carbon-chlorine-flourine comprising gas, or a combination thereof. A plasma is then generated from the etchant gas.

By chlorine-comprising gas, there is meant a gaseous species, such as for example, $Cl_2$. By carbon-fluoride gas, there is meant a gaseous species containing carbon and fluorine, such as for example, $C_xF_y$, which can be $CF_4$, $C_2F_4$, $C_2F_6$, and combinations thereof. By carbon-chlorine-flourine comprising gas, there is meant a gaseous species containing carbon, chlorine and fluorine, such as for example, $CF_3Cl$. By carbon-fluoride-hydrogen gas, there is meant a gaseous species containing carbon, fluorine, and hydrogen, such as for example, $C_xH_yF_z$, which can be $CHF_3$. Preferably, the carbon-fluoride-hydrogen gas contains no element except C, F, and H.

The process of the present invention is effected with multi-stages. In the first step of the process, both the TiN ARC layer 118 and the OARC layer 120 are etched. The composition is preferably selected to provide an etching selectivity ratio, defined as the ratio of the combined etch rate of the TiN ARC 118 and OARC 120 layers to the etch rate of the resist, of at least about 2, and more preferably at least about 3. A mainetch step is then performed for etching the conductive layer 117. Next, an overetch step is performed for etching the base diffusion barrier 116 and the oxide layer 114. Last, a fifth dechucking step is performed for releasing the substrate 100. In addition, a secondary step can be performed after the first step to improve the results, namely, to eliminate notching. These steps can be performed as an in situ process. The processes are described in detail below.

Multiple Stage Process

ARC Etch

A suitable combination of gases for effecting the first stage of the process can comprise $CHF_3$ and $Cl_2$ in a volumetric flow ratio of from about 1:7 to approximately 1:5 and preferably of approximately 1:6. This combination of gases provides an etching selectivity ratio of at least approximately 2. For a 20 liter process chamber, $Cl_2$ flow rates are preferably from approximately 90 to 100 sccm and $CHF_3$ flow rates are preferably approximately 15 sccm.

During the etching process, the chamber 500 is typically maintained at a pressure ranging from approximately 6 to 20 mTorr, and more preferably approximately 10 mTorr. A plasma is generated from the etchant gas by applying an RF current having a frequency of about 2 MHz to the inductive coil 508. Typically, the power level of the RF current applied to the coil is approximately 1200 Watts. An RF bias current is also applied to the cathode 504 at a frequency of about 13.56 MHz and at a power level sufficient to cause the plasma generated by the inductive coil 508 to impinge upon and etch the substrate 100. A suitable cathode RF bias current power level is approximately 30 Watts.

Main Etch

A suitable combination of gases for effecting the third stage can comprise $Cl_2$, $BCl_3$ and $CHF_3$ in a volumetric flow ratio of preferably 1:2.5:16. For a 20 liter process chamber, $Cl_2$ flow rates are preferably approximately 80 sccm, $BCl_3$ flow rates are preferably approximately 30 sccm and $CHF_3$ flow rates are preferably approximately 5 sccm.

During this step, the chamber 500 is typically maintained at a pressure of approximately 10 mTorr, and more preferably approximately 12 mTorr. A plasma is generated from the etchant gas by applying an RF current having a frequency of about 2 MHz to the inductive coil 508. Typically, the power level of the RF current applied to the coil is approximately 1000 Watts. An RF bias current is also applied to the cathode 504 at a frequency of about 13.56 MHz and at a power level sufficient to cause the plasma generated by the inductive coil 508 to impinge upon and etch the substrate 100. A suitable cathode RF bias current power level is approximately 80 Watts.

Over Etch

A suitable combination of gases for effecting the fourth stage can comprise $Cl_2$ and $BCl_3$ in a volumetric flow ratio of preferably 1:2. For a 20 liter process chamber, $Cl_2$ flow rates are preferably approximately 60 sccm and $BCl_3$ flow rates are preferably approximately 30 sccm.

During this step, the chamber 500 is typically maintained at a pressure of approximately 10 mTorr. A plasma is generated from the etchant gas by applying an RF current having a frequency of about 2 MHz to the inductive coil 508. Typically, the power level of the RF current applied to the coil is approximately 1000 Watts. An RF bias current is also applied to the cathode 504 at a frequency of about 13.56 MHz and at a power level sufficient to cause the plasma generated by the inductive coil 508 to impinge upon and etch the substrate 100. A suitable cathode RF bias current power level is approximately 80 Watts.

Dechucking Stage

A suitable gas for effecting the dechucking stage can comprise $N_2$. For a 20 liter process chamber, $N_2$ flow rates are preferably approximately 50 sccm. During this step, the chamber 500 is typically maintained with the throttle valve fully open (TFO). Typically, the power level of the RF current applied to the coil is approximately 400 Watts. An RF bias current is also applied to the cathode 504 at a power level of approximately 100 Watts.

Alternate Secondary Stage After First Stage

Alternatively, a secondary etch step can be performed to improve results by eliminating notching. A suitable combination of gases for effecting the second stage can comprise $Cl_2$ and $BCl_3$ in a volumetric flow ratio of preferably 1:1. For a 20 liter process chamber, $Cl_2$ flow rates are preferably approximately 50 sccm and $BCl_3$ flow rates are preferably approximately 50 sccm.

During this step, the chamber 500 is typically maintained at a pressure of approximately 10 mTorr, and more preferably approximately 8 mTorr. A plasma is generated from the etchant gas by applying an RF current having a frequency of about 2 MHz to the inductive coil 508. Typically, the power level of the RF current applied to the coil is approximately 800 Watts. An RF bias current is also applied to the cathode 504 at a frequency of about 13.56 MHz and at a power level sufficient to cause the plasma generated by the inductive coil 508 to impinge upon and etch the substrate 100. A suitable cathode RF bias current power level is approximately 100 Watts.

Process Conditions

In the etching process of the present invention, the anodized aluminum sidewall 501 is heated to a temperature of from about 80° C. to prevent the deposition of condensable etchant byproduct species on the sidewall 501. The dielectric ceiling 502 is typically maintained at a temperature of about 80° C., to prevent polymer deposition to reduce particles in the process zone. The cathode temperature is approximately 35° C. Also, in both versions of the process, the plasma formed from the etchant gas heats the substrate 100 to a temperature of about 50 to 60° C. The temperature of the substrate 100 is maintained at a substantially constant level by passing helium on the backside of the substrate 100. Typically, the helium is flowed at pressure of from about 10 Torr.

IV. Examples

The following examples demonstrate the effectiveness of the processes according to the present invention. In these examples, a decouple plasma source metal etch apparatus, such as the DPS Metal Etch Centura System commercially available from Applied Materials, Santa Clara, Calif., was used.

The examples were carried out on 6-inch diameter silicon wafers. The wafer had thereon a silicon oxide layer 114, a base diffusion barrier layer 116, a conductive layer 117 comprising an aluminum alloy (with approximately 0.5% copper), a TiN ARC layer 118 ranging from approximately 200–500 Å thick and an OARC 120 layer ranging from approximately 600–2000 Å thick.

The following notation is applicable for all of the examples: BT1 (Breakthrough 1): An integrated process for OARC and TiN ARC opening etch. Etch time is determined by 703 nm emission line (Ti line). The CD can be changed by $P_b$, $P_s$, pressure, He cooling, and total flow rate; BT2 (Breakthrough 2): A bridging process for better notch control; ME: A standard main etch process ($CHF_3$) for 0.25μ; and OE: A standard over etch process.

Example 1

Table I lists the process conditions used for Example 1. This example illustrates a multi-stage process, in which an etchant gas comprising $Cl_2$ and $CHF_3$ was used. The etch rate was measured by examining a cross section of the etched wafer in a scanning electron microscope using conventional techniques. The etch rate reflects the combined etch rate for both the TiN ARC and the OARC layers.

Example 1

TOTAL ARC=600 Å Organic ARC/200 Å TiN ARC Etch Process

| Description | Step I (BT1) | Step II (Mainetch) | Step III (Overetch) | Step IV (Dechuck) |
|---|---|---|---|---|
| $BCl_3$ (sccm) | | 30 | 30 | 0 |
| $Cl_2$ (sccm) | 90 | 80 | 60 | 0 |
| $CHF_3$ (sccm) | 15 | 5 | | $50N_2$ |
| Pressure (mTorr) | 10 | 12 | 10 | TFO |
| Source Power (Watts) | 1200 | 1000 | 1000 | 400 |
| Bias Power (Watts) | 30 | 80 | 80 | 100 |
| He Cooling (Torr) | 10 | 10 | 7 | 0 |
| Time (seconds) | 37 | 23 | 23 | 1 |

TFO = Throttle Valve Fully Open

Examples 2–4

Tables II–IV, respectively, lists the process conditions used for Examples 2–4. These examples illustrate multi-stage processes, in which the etchant gases comprising $Cl_2$, $BCl_3$ and $CHF_3$ were used with a secondary etch to eliminate notching. The etch rate was measured by examining a cross section of the etched wafer in a scanning electron microscope using conventional techniques. The etch rate reflects the combined etch rate for both the TiN ARC and the OARC layers.

Example 2

ARC=600 Å Organic ARC/200 Å TiN ARC Etch Process

| Description | Step I (BT1) | Step II (BT2) | Step III (Mainetch) | Step IV (Overetch) | Step V (Dechuck) |
|---|---|---|---|---|---|
| $BCl_3$ (sccm) | | 50 | 30 | 30 | 0 |
| $Cl_2$ (sccm) | 90 | 50 | 80 | 60 | 0 |
| $CHF_3$ (sccm) | 15 | | 5 | | $50N_2$ |

-continued

| Description | Step I (BT1) | Step II (BT2) | Step III (Mainetch) | Step IV (Overetch) | Step V (Dechuck) |
|---|---|---|---|---|---|
| Pressure (mTorr) | 10 | 8 | 12 | 10 | TFO |
| Source Power (Watts) | 1200 | 800 | 1000 | 1000 | 400 |
| Bias Power (Watts) | 30 | 100 | 80 | 80 | 100 |
| He Cooling (Torr) | 10 | 10 | 10 | 7 | 0 |
| Time (seconds) | 37 | 7 | 23 | 23 | 1 |

TFO = Throttle Valve Fully Open

-continued

| Description | Step I (BT1) | Step II (BT2) | Step III (Mainetch) | Step IV (Overetch) | Step V (Dechuck) |
|---|---|---|---|---|---|
| He Cooling (Torr) | 10 | 10 | 10 | 10 | 0 |
| Time (seconds) | 60 | 7 | 23 | 45 | 1 |

TFO = Throttle Valve Fully Open

The results of the above working examples demonstrate that a process according to the invention provides a high degree of anisotropic etching, substantially no undercutting or notching, a high etch selectivity, and very low critical dimension loss. The table below provides typical results of the above working examples.

RESULTS

| | Etch Selectivity (OARC/PR) | Etch Rate Non-Uniformity | Etch Rate (Å/min) | OARC Profile | CD(center) | CD(edge) |
|---|---|---|---|---|---|---|
| Typical Results | 2.0:1 | 4% | 3700 | 90° | 0.22/0.28 | 0.22/0.28 |

Example 3

ARC=1600 Å Organic ARC/200 Å TiN ARC Etch Process

| Description | Step I (BT1) | Step II (BT2) | Step III (Mainetch) | Step IV (Overetch) | Step V (Dechuck) |
|---|---|---|---|---|---|
| $BCl_3$ (sccm) | | 50 | 30 | 30 | 0 |
| $Cl_2$ (sccm) | 90 | 50 | 80 | 60 | 0 |
| $CHF_3$ (sccm) | 15 | | 5 | | $50N_2$ |
| Pressure (mTorr) | 10 | 8 | 12 | 10 | TFO |
| Source Power (Watts) | 1200 | 800 | 1000 | 1000 | 400 |
| Bias Power (Watts) | 30 | 100 | 80 | 80 | 100 |
| He Cooling (Torr) | 10 | 10 | 10 | 7 | 0 |
| Time (seconds) | 62 | 7 | 23 | 23 | 1 |

TFO = Throttle Valve Fully Open

Example 4

ARC=2000 Å Organic ARC/500 Å TiN ARC Etch Process

| Description | Step I (BT1) | Step II (BT2) | Step III (Mainetch) | Step IV (Overetch) | Step V (Dechuck) |
|---|---|---|---|---|---|
| $BCl_3$ (sccm) | | 50 | 30 | 30 | 0 |
| $Cl_2$ (sccm) | 100 | 50 | 80 | 70 | 0 |
| $CHF_3$ (sccm) | 15 | | 5 | | $50N_2$ |
| Pressure (mTorr) | 12 | 8 | 12 | 10 | TFO |
| Source Power (Watts) | 1200 | 800 | 1000 | 1000 | 400 |
| Bias Power (Watts) | 30 | 100 | 80 | 80 | 100 |

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A process for etching a multi-layer coating from a base of a substrate, the process comprising:
   (a) placing a substrate into a process zone;
   (b) introducing into the process zone a first etchant gas comprising at least one of a carbon-fluoride-hydrogen gas, a carbon-fluoride gas, and a carbon-chlorine-fluorine-containing gas, said first etchant gas in combination with a chlorine-containing gas;
   (c) forming a plasma from the etchant gas for etching at least one of the combinations of, (1) an organic anti-reflective coating layer and a titanium nitride anti-reflective coating layer, and (2) multiple titanium comprising layers and an anti-reflective coating comprising titanium, located on the substrate;
   (d) introducing into the process zone a second etchant gas comprising boron-chlorine gas and chlorine gas; and
   (e) forming a plasma from the second etchant gas to thereby eliminate notching of the titanium nitride anti-reflective coating and organic anti-reflective coating layers on the substrate.

2. The process of claim 1, wherein the carbon-fluoride-hydrogen gas comprises a gas selected from the group consisting of $C_xH_yF_z$, the carbon-fluoride gas comprises a gas selected from the group consisting of $C_xF_y$, the carbon-chlorine-fluorine-containing gas is $CF_3Cl$, the boron-chlorine gas is $BCl_3$, and the chlorine-containing gas comprises a gas selected from the group consisting of at least one of a chlorine-comprising gas and $Cl_2$.

3. The process of claim 1, wherein an inductive coil encircles the process zone:
   wherein the step of forming a plasma from the first etchant gas comprises applying an RF current having a power level of from about 700 to about 1600 Watts to the inductive coil and wherein the substrate is placed on a cathode in the process zone and an RF current having a power level of from about 10 to about 100 Watts is applied to the cathode; and wherein the step of forming a plasma from the second etchant gas comprises applying an RF current having a power level of from about 700 to about 900 Watts to the inductive coil and wherein the substrate is placed on a cathode in the process zone and an RF current having a power level of from about 90 to about 110 Watts is applied to the cathode.

4. The process of claim 1, wherein the process zone is maintained at a pressure from about 8 mTorr to about 12 mTorr during steps (b–c) and wherein the process zone is maintained at a pressure from about 6 mTorr to about 10 mTorr during steps (d–e).

5. The invention as set forth in claim 1, wherein said steps are performed in situ and without intervening processing steps.

6. A process for etching a substrate, comprising:
(a) providing a substrate with an organic anti-reflective coating layer overlying a titanium nitride anti-reflective coating layer, an insulative oxide layer directly overlying the base of the substrate, a base diffusion barrier layer overlying the insulative oxide layer and a conductive layer underlying the titanium nitride anti-reflective coating layer;
(b) placing the substrate into a process zone;
(c) introducing into the process zone a first etchant gas comprising carbon-fluoride-hydrogen gas and chlorine-containing gas;
(d) forming a plasma from the first etchant gas for etching the titanium nitride anti-reflective coating and organic anti-reflective coating layers on the substrate;
(e) introducing into the process zone a supplemental etchant gas comprising boron-chlorine gas and chlorine gas;
(f) forming a plasma from the supplemental etchant gas to thereby eliminate notching of the titanium nitride anti-reflective coating and organic anti-reflective coating layers on the substrate;
(g) introducing into the process zone a second etchant gas comprising carbon-fluoride-hydrogen gas, boron-chlorine gas and chlorine-containing gas;
(h) forming a plasma from the second etchant gas for etching the conductive layer on the substrate;
(i) introducing into the process zone a third etchant gas comprising boron-chlorine gas and chlorine-containing gas; and
(j) forming a plasma from the third etchant gas for etching the base diffusion barrier and insulative oxide layers on the substrate.

7. A process for etching a substrate comprising at least one of the combinations from the group consisting of: (1) an organic anti-reflective coating layer and a titanium nitride anti-reflective coating layer, and (2) multiple titanium-comprising layers and an anti-reflective coating comprising titanium, located on the substrate, the process comprising:
(a) placing the substrate into a process zone;
(b) introducing into the process zone an etchant gas comprising at least one of a carbon-fluoride gas and a carbon-chlorine-fluorine-containing gas, said etchant gas in combination with a chlorine-containing gas; and
(c) forming a plasma from the etchant gas for etching the at least one of the combinations of: (1) the organic anti-reflective coating layer and the titanium nitride anti-reflective coating layer, and (2) the multiple titanium comprising layers and the anti-reflective coating comprising titanium, of the substrate;
wherein the etchant gas comprises the carbon-chlorine-fluorine-containing gas, and wherein the carbon-chlorine-fluorine-containing gas comprises a gas selected from the group consisting of $C_xF_yCl_z$.

8. A process for etching a substrate comprising at least one of the combinations from the group consisting of: (1) an organic anti-reflective coating layer and a titanium nitride anti-reflective coating layer, and (2) multiple titanium-comprising layers and an anti-reflective coating comprising titanium, located on the substrate, the process comprising:
(a) placing the substrate into a process zone;
(b) introducing into the process zone an etchant gas comprising at least one of a carbon-fluoride gas and a carbon-chlorine-fluorine-containing gas, said etchant gas in combination with a chlorine-containing gas; and
(c) forming a plasma from the etchant gas for etching the at least one of the combinations of: (1) the organic anti-reflective coating layer and the titanium nitride anti-reflective coating layer, and (2) the multiple titanium comprising layers and the anti-reflective coating comprising titanium, of the substrate;
wherein the etchant gas comprises the carbon-chlorine-fluorine-containing gas, and wherein the carbon-chlorine-fluorine-containing gas comprises $CF_3Cl$.

9. A process for etching a substrate comprising at least one of the combinations from the group consisting of: (1) an organic anti-reflective coating layer and a titanium nitride anti-reflective coating layer, and (2) multiple titanium-comprising layers and an anti-reflective coating comprising titanium, located on the substrate, the process comprising:
(a) placing the substrate into a process zone;
(b) introducing into the process zone an etchant gas comprising at least one of a carbon-fluoride gas and a carbon-chlorine-fluorine-containing gas, said etchant gas in combination with a chlorine-containing gas;
(c) forming a plasma from the etchant gas for etching the at least one of the combinations of: (1) the organic anti-reflective coating layer and the titanium nitride anti-reflective coating layer, and (2) the multiple titanium comprising layers and the anti-reflective coating comprising titanium, of the substrate;
(d) introducing into the process zone a second etchant gas comprising boron-chlorine gas and chlorine gas; and
(e) forming a plasma from the second etchant gas for additionally etching the at least one of the combinations of: (1) the organic anti-reflective coating layer and the titanium nitride anti-reflective coating layer, and (2) the multiple titanium comprising layers and the anti-reflective coating comprising titanium, of the substrate;
wherein the at least one of the combinations of (1) the organic anti-reflective coating layer and the titanium nitride anti-reflective coating layer, and (2) the multiple titanium comprising layers and the anti-reflective coating comprising titanium, is the combination of the organic anti-reflective coating layer and the titanium nitride anti-reflective coating layer, and wherein forming a plasma from the second etchant gas eliminates notching of the titanium nitride anti-reflective coating and organic anti-reflective coating layers on the substrate.

10. A process for etching a multi-layer coating from a base of a substrate, the process comprising:

(a) placing into a process zone a substrate comprising an organic anti-reflective coating layer and a titanium nitride anti-reflective coating layer;

(b) introducing into the process zone an etchant gas comprising at least one of a carbon-chlorine-fluorine-containing gas, said etchant gas in combination with a chlorine-containing gas; and (c) forming a plasma from the etchant gas for etching the organic anti-reflective coating layer and the titanium nitride anti-reflective coating layer, located on the substrate;

wherein the etchant gas comprises the carbon-chlorine-fluorine-containing gas, and wherein the carbon-chlorine-fluorine-containing gas comprises a gas selected from the group consisting of $C_xF_yCl_z$.

11. A process for etching a multi-layer coating from a base of a substrate, the process comprising:

(a) placing into a process zone a substrate comprising an organic anti-reflective coating layer and a titanium nitride anti-reflective coating layer;

(b) introducing into the process zone an etchant gas comprising at least one of a carbon-chlorine-fluorine-containing gas, said etchant gas in combination with a chlorine-containing gas;

(c) forming a plasma from the etchant gas for etching the organic anti-reflective coating layer and the titanium nitride anti-reflective coating layer, located on the substrate;

(d) introducing into the process zone a second etchant gas comprising boron-chlorine gas and chlorine gas; and (e) forming a plasma from the second etchant gas for additionally etching the organic anti-reflective coating layer and the titanium nitride anti-reflective coating layer, of the substrate;

wherein forming a plasma from the second etchant gas eliminates notching of the titanium nitride anti-reflective coating and organic anti-reflective coating layers on the substrate.

* * * * *